(12) United States Patent
Reil et al.

(10) Patent No.: US 7,171,746 B2
(45) Date of Patent: Feb. 6, 2007

(54) PROCESS FOR APPLYING CONDUCTOR TRACKS TO THE SURFACE OF PLASTICS MOLDINGS

(75) Inventors: Frank Reil, Seeheim (DE); Stefan Diel, Lorzweiler (DE)

(73) Assignee: Ticona GmbH (DE)

( * ) Notice: Subject to any disclaimer, the term of this patent is extended or adjusted under 35 U.S.C. 154(b) by 477 days.

(21) Appl. No.: 10/758,715

(22) Filed: Jan. 16, 2004

(65) Prior Publication Data

US 2004/0152345 A1 Aug. 5, 2004

(30) Foreign Application Priority Data

Jan. 17, 2003 (DE) ................. 103 01 516

(51) Int. Cl.
*H01K 3/22* (2006.01)
(52) U.S. Cl. ............................ 29/848; 29/846; 29/847; 29/851; 29/121.66; 29/121.69; 29/121.74; 29/121.77; 439/55
(58) Field of Classification Search ................. 29/848, 29/846, 847, 851; 219/121.66, 121.69, 121.74, 219/121.77; 439/55
See application file for complete search history.

(56) References Cited

U.S. PATENT DOCUMENTS 5,674,414 A * 10/1997 Schweizer ............. 219/121.77
5,955,179 A * 9/1999 Kickelhain et al. ......... 428/210

OTHER PUBLICATIONS

Römpp, Lexikon Chemie, Stichwort "Schaumkunststoffe" [(Römpp, Chemical Encyclopedia, keyword "plastics foams"], p. 3952, G. Thieme Verlag, Stuttgart, New York, 1997).
J.L. Throne in Journal of Cellular Plastics, Jul./Aug. 1972, p. 208-210.
Encyclopedia of Polymer Science and Engineering, vol. 15, "Structural Foams", p. 771-773, John Wiley & Sons, 1985.

* cited by examiner

*Primary Examiner*—A. Dexter Tugbang
*Assistant Examiner*—Tim Phan
(74) *Attorney, Agent, or Firm*—Connolly Bove Lodge & Hutz LLP

(57) ABSTRACT

A process is described in which surfaces of foamed plastics are provided with electrical conductor tracks, with the aid of selectively ablating processes.

The process permits low-cost production of moldings from plastic with conductor tracks integrated on the surface.

The products of the process may be used in the electrical and electronics industries, for example.

9 Claims, No Drawings

PROCESS FOR APPLYING CONDUCTOR TRACKS TO THE SURFACE OF PLASTICS MOLDINGS

CROSS REFERENCE TO RELATED DOCUMENTS

This application claims priority to Germany Patent Application Number 103 01 516.7, filed on Jan. 17, 2003.

FIELD OF THE INVENTION

The present invention relates to a process in which surfaces of plastics are provided with electrical conductor tracks, with the aid of selectively ablating processes.

BACKGROUND OF THE INVENTION

Moldings made from plastic with integrated electrically conducting layers or tracks are well-known, for example from the electrical and electronics industries.

Complicated cable harnesses have often been utilized hitherto for supply of electricity to components which bear electrical assemblies and which are used in the motor vehicle sector or in household machines, for example.

Another method attaches conductor tracks to the plastics surface by hot stamping. In this process, metal foils, for example composed of copper, gold, or nickel, with thicknesses which are generally from 18 to 150 μm, are stamped onto the plastics substrate, using a heated block.

Another group of processes involves the use of metallizable plastics which are arranged in multistage processes in such a way as to give conductor tracks via partial metallization.

The processes known hitherto for producing moldings from plastic with integrated conductor tracks are very costly and require complicated apparatus, and for this reason attempts are being made to find alternative options.

It is well known that plastics can be rendered electrically conductive via addition of electrically conductive particles. The extent of electrical conductivity can be influenced via the nature of the fillers, and their size, shape, distribution, and amount.

It is also known that the dependency of the electrical conductivity of a plastic on the amount of the particles used takes the form of what is known as a percolation curve. Accordingly, the plastic behaves as an electrical insulator at low filler contents. Starting at a certain amount of filler, the electrical conductivity suddenly rises, because bridges of conductive material form within the molding.

The production of plastics foams with foamed core and with solid outer skin is likewise known. Foams of this type are termed integral foams or structural foams (cf. Römpp, Lexikon Chemie, Stichwort "Schaumkunststoffe" [Römpp, Chemical Encyclopedia, keyword "plastics foams"], p. 3952, G. Thieme Verlag, Stuttgart, N.Y., 1997). These foams feature a highly non-uniform distribution of properties, such as density, within the structure (cf. J. L. Throne in Journal of Cellular Plastics, July/August 1972, p. 208–210, and Encyclopedia of Polymer Science and Engineering, Vol. 15, "Structural Foams", p. 771–773, John Wiley & Sons, 1985).

SUMMARY OF THE INVENTION

Starting from this prior art, the invention provides a process with which surfaces of plastics can be provided with electrical conductor tracks, and which can be carried out cost-effectively in a simple manner.

The invention is based on the discovery that the electrically conductive surface of structural foams which have an electrically insulating core can be altered in a controlled manner in such a way that, at these areas, electrically non-conducting portions of the surface are produced, thus permitting the formation of conductor tracks.

DETAILED DESCRIPTION OF THE INVENTION

The present invention provides a process for applying conductor tracks to the surface of a plastics molding, encompassing the steps of:

a) using, as starting material, a molding with at least one plastics surface, where the molding comprises a structural foam with a solid outer skin and a cellular core, and comprises electrically conductive particles, their amount being such that the core is electrically insulating and the outer skin is electrically conductive, and b) ablating those portions of the plastics surface on which no conductor tracks are intended to run, with the aid of a selectively ablating process, so as to form a predetermined pattern of electrically non-conducting sections at the treated areas on the plastics surface, thus producing conductor tracks at the untreated areas on the surface.

For the inventive process, use may be made of any desired selectively ablating processes, for example mechanical, chemical, or thermal processes with which predetermined parts of the surface of the molding can be ablated, thus exposing the electrically non-conducting foam situated thereunder. Examples of selectively ablating processes are mechanical ablating processes, such as milling, planing, stamping, or blasting processes, such as water-jet processes or sandblasting processes, electromechanical ablating processes, such as spark erosion, or in particular the treatment of the surface with electromagnetic radiation which is absorbed by the surface.

Examples of electromagnetic radiation are X-rays or preferably infrared radiation, visible light, or UV radiation.

Particular preference is given to laser radiation, because this can have a high energy density. Examples of lasers are excimer lasers, YAG lasers, or $CO_2$ lasers.

For the purposes of this description, "electrically insulating" applies to volume resistivities greater than $10^6$ ohm*cm and/or surface resistivities greater than $10^7$ ohm.

For the purposes of this description, "electrically conductive" applies to volume resistivities smaller than $10^6$ ohm*cm and/or surface resistivities smaller than $10^7$ ohm.

The structural foam used according to the invention has a solid outer skin and a cellular core, both of which comprise electrically conductive particles. The amount of the electrically conductive particles here is to be selected in such a way that the core is electrically insulating and the outer skin is electrically conductive. There will generally be no, or no substantial, difference between the amount, based on the plastic, of electrically conductive particles in the core and in the outer skin. The difference in the electrical conductivity of the two portions of the molding results mainly from the pore structure of the core and the coherent structure of the outer skin.

The solid outer skin typically has a thickness of from 50 to 1000 μm, preferably from 100 to 400 μm, and the cellular core has a thickness of from 200 to 10 000 μm, preferably from 1000 to 4000 μm.

The structural foam used according to the invention with a solid outer skin and a cellular core may be produced in any desired manner. For example, it may be produced by chemical foaming, i.e. via decomposition of a blowing agent to give a gas which in turn foams the plastic, or by physical foaming, i.e. an inert gas injected under high pressure as blowing agent into the plastics melt to be foamed.

The structural foam is preferably formed via structural foam molding processes.

The cellular core of the structural foams used according to the invention may have any desired types, sizes, and numbers of cells. For example, the foams may be open-cell (=mutually interconnected cells) or closed-cell (=no mutual interconnection between the cells). Foams of mixed-cell type, i.e. foams with open and closed cells, may also, of course, be used.

At least the number of cells present in the outer skin of the structural foams used according to the invention is markedly less than that in the cellular core. The quantity of cells here must not exceed a certain order of magnitude, in order that the electrical conductivity of the outer skin is adequate in the intended application.

The size of the cells in the structural foams used according to the invention may vary within the range from 0.1 to 500 μm.

In the cellular core, the number of cells per $cm^3$ of foam may vary within the range from $10^5$ to $10^{12}$. These are typical values, and the values in an individual case may be lower or higher than these.

Typical internal surface areas (measured by the B.E.T. method) of the cellular cores of the structural foams used according to the invention vary in the range from 0.1 to 400 $m^2/g$.

It is preferable to use structural foams whose cellular core is a microcellular foam. These are foams with cells whose size is in the range from 1 to 20 μm, preferably from 1 to 10 μm. They are particularly preferably closed-cell microcellular foams with a pore-free or almost pore-free peripheral zone.

The electrically conductive particles used according to the invention may be selected from any desired materials. Examples of these are metals or metal alloys, carbon black, graphite, and/or electrically conductive plastics. It is preferable to use a metal with good electrical conductivity.

The particles used may involve a very wide variety of forms and of material combinations. By way of example, the materials used take the form of powders or fibers, and the particles here may in turn have been coated with electrically conductive materials.

Examples of particles whose use is preferred are conductivity blacks, graphite powders, metal-coated graphite powders, e.g. nickel-coated graphite powder, carbon fibers, metal fibers, e.g. stainless-steel fibers, metal-coated carbon fibers, and metal powders.

The selection of the type and amount of suitable particles can have a favorable effect not only on the electrical conductivity but also on other properties, such as shrinkage behavior (isotropic or anisotropic), strength, elongation at break, modulus of elasticity, magnetic properties, and screening with respect to electromagnetic radiation.

The inventive process can produce a very wide variety of forms of conductor track patterns on the plastics surface. The insulating areas of the surface form at the selectively ablated areas, and the conductor track patterns are produced at the areas not ablated.

The invention also provides the moldings obtainable by the process described.

These are therefore moldings with at least one plastics surface where the molding comprises a structural foam with a solid outer skin and a cellular core, and comprises electrically conductive particles, their amount being such that the core is electrically insulating and the outer skin is electrically conductive, where predetermined portions of the outer skin are present in the form of a conductor track pattern, and the other portions of the outer skin of the plastics surface have been ablated in such a way that at these areas a predetermined pattern of electrically non-conducting portions of the plastics surface has developed.

By way of example, moldings bearing conducting structures may be components used in the electrical and electronics industries, or else may be any other large or small plastics components of any desired shape which have conducting elements on certain areas.

The molding processed according to the invention may also be a constituent of a composite with other materials, and/or may also comprise components on the surface.

Because the conductor structures or components bearing conductor structures have been applied to the surface of the plastics molding, complicated cable harnesses and contacting with plug connectors can be omitted in numerous components by using the inventive process. The present process can also reduce the high costs, including the high apparatus cost, for the hot-stamping of conductor tracks, or for the production of conductor tracks by means of metallization.

The molding to be provided with conductor tracks may have been produced from any desired plastic.

In principle, any of the foamable plastics may be used for the inventive process.

If the surface-treatment process undertaken is treatment with electromagnetic radiation, the foamed plastics have to exhibit sufficient absorption of the electromagnetic radiation intended for the structuring of the surface. Addition of additives can make a contribution here.

By way of examples of plastics, mention may be made here of polystyrene and styrene copolymers, polyvinyl chloride, polycarbonates, polyesters, such as liquid-crystalline polyesters ("LCPs"), or polybutylene terephthalate ("PBT"), or homo- or copolyacetals ("POMs"), polyphenylene sulfide, polyolefins, polyurethanes, polyisocyanurates, polycarbodiimide, polymethacrylimides, polyamides, acrylonitrile-butadiene-styrene block copolymers ("ABSs"), phenolic resins, and urea resins.

Preference is given to the use of liquid-crystalline polyesters, polybutylene terephthalate, homo- and copolyacetals, or else polyphenylene sulfide.

These plastics may also comprise the conventional auxiliaries, additives, fillers, and reinforcing agents, as long as their use does not significantly adversely affect the property profile needed for the structuring of the surface.

Use may also be made of homogeneous or heterogeneous plastics mixtures. If electromagnetic radiation is used for the structuring of the surfaces, the wavelength and the intensity of the radiation are to be matched to the nature of the plastic used. The required irradiation time, and therefore the processing rate achievable, are particularly dependent on these factors. Transparent plastics and plastics with no significant content of absorbent constituents may have additives, such as carbon blacks, fillers, or pigments, these providing adequate absorption of the radiation, if the presence of the electrically conductive particles does not in itself provide for adequate absorption of the radiation.

Examples of transparent plastics are ethylene-norbornene copolymers, polystyrene, polymethyl methacrylate, and other acrylate-based plastics.

Radiation sources which may be used are the sources which are conventional per se for electromagnetic radiation. Examples of these are types of laser, such as carbon dioxide lasers, YAG (yttrium-aluminum-garnet) lasers, or excimer lasers.

The inventive process may be used in many sectors of industry. By way of example, in the automotive industry to produce equipment, such as instrument clusters, door locks, or engine controls; or in the electronics industry to manufacture printed circuit boards, for example for the production of telecommunication devices, computers, or hi-fi equipment.

The invention also provides the use of structural foams comprising electrically conductive particles for producing components in which conductor tracks have been formed on predetermined portions of the surface.

What is claimed is:

1. A process for applying conductor tracks to the surface of a plastics molding, encompassing the steps of:
   a) using, as starting material, a molding with at least one plastics surface, where the molding comprises a structural foam with a solid outer skin and a cellular core, and comprises electrically conductive particles, their amount being such that the core is electrically insulating and the outer skin is electrically conductive, and
   b) ablating those portions of the solid outer skin with conductive particles therein to expose the electrically insulating cellular core where no conductor tracks are intended to run, with the aid of a selectively ablating process, so as to form a predetermined pattern of electrically non-conducting sections in the cellular core at the treated areas on the plastics surface, thus producing conductor tracks in the solid outer skin at the untreated areas on the surface.

2. The process as claimed in claim 1, wherein the selectively ablating process is selected from the group consisting of mechanical ablation processes, abrasive-blasting processes, electromechanical ablation processes, or treatment of the surface with electromagnetic radiation which is absorbed by the surface.

3. The process as claimed in claim 2, wherein the electromagnetic radiation is selected from the group consisting of X-rays, infrared radiation, visible light, or UV radiation.

4. The process as claimed in claim 3, wherein the electromagnetic radiation is laser radiation.

5. The process as claimed in claim 1, wherein the molding used comprises a structural foam with solid outer skin and cellular core, the solid outer skin of which has a thickness of from 50 to 1000 µm, and the cellular core of which has a thickness of from 200 to 10 000 µm.

6. The process as claimed in claim 1, wherein the molding used comprises a structural foam with a solid outer skin and with a cellular core, the cellular core of which is a microcellular foam with cells whose size is in the range from 1 to 20 µm.

7. The process as claimed in claim 1, wherein the core has a volume resistivity of more than $10^7$ ohm*cm and the outer skin has a volume resistivity of less than $10^6$ ohm*cm.

8. The process as claimed in claim 1, wherein the electrically conductive particles are selected from the group consisting of conductivity blacks, graphite powders, metal-coated graphite powders, carbon fibers, metal fibers, metal-coated carbon fibers, metal powders, or combinations of one or more of these components.

9. The process as claimed in claim 1, wherein the plastic is selected from the group consisting of liquid-crystalline polyesters, polybutylene terephthalate, homo- and copoly-acetals, and polyphenylene sulfide, and mixtures of one or more of these.

* * * * *